(12) United States Patent
Schober et al.

(10) Patent No.: US 6,680,523 B2
(45) Date of Patent: Jan. 20, 2004

(54) SEMICONDUCTOR WAFER WITH PROCESS CONTROL MODULES

(76) Inventors: Joachim H. Schober, Monsbergergasse 6/2, A-8010 Graz (AT); Heimo Scheucher, Kogelbuchstrasse 23, A-8302 Langegg (AT); Paul Hubmer, Alte Poststrasse 57/9, A-8020 Graz (AT)

( * ) Notice: Subject to any disclaimer, the term of this patent is extended or adjusted under 35 U.S.C. 154(b) by 0 days.

(21) Appl. No.: 10/081,893

(22) Filed: Feb. 21, 2002

(65) Prior Publication Data

US 2002/0117735 A1 Aug. 29, 2002

(30) Foreign Application Priority Data

Feb. 27, 2001 (EP) .............................................. 01890050

(51) Int. Cl.$^7$ ............................................ H01L 23/544
(52) U.S. Cl. ......................................... 257/620; 257/48
(58) Field of Search ................................... 257/620, 48

(56) References Cited

U.S. PATENT DOCUMENTS

| 5,128,737 A | * | 7/1992 | van der Have | ............. 257/503 |
| 5,990,488 A | | 11/1999 | Nistler et al. | .................. 257/48 |

* cited by examiner

Primary Examiner—David L. Talbott
Assistant Examiner—Luan Thai
(74) Attorney, Agent, or Firm—Steven R. Biren

(57) ABSTRACT

A semiconductor wafer (1) has a multitude of chips (5), of which chips (5) each one of a given number of chips (5) is situated in one of a multitude of adjacent exposure fields (2), and further has process control modules (4) which are each arranged in an exposure field (2), namely each in place of at least one chip (5).

4 Claims, 1 Drawing Sheet

SEMICONDUCTOR WAFER WITH PROCESS CONTROL MODULES

The invention relates to a semiconductor wafer having a multitude of chips, of which chips each one of a given number of chips is situated in one of a multitude of adjacent exposure fields, and having process control modules which are each arranged in a given area on the semiconductor wafer.

Such a semiconductor wafer has been marketed in several variants and is consequently known.

In a variant of such a known semiconductor wafer the given areas, in each of which a process control module is located, are formed by so-called drop-in areas which contain so-called alignment markers, which are reference or positioning structures by means of which the semiconductor wafer can be aligned with respect to an exposure mask in the course of the fabrication of the semiconductor wafer. This variant has the disadvantage that there are only a very small number of process control modules, i.e. only two or three of such process control modules, per semiconductor wafer, which has the drawback that as a result of the small number of process control modules these process control modules cannot detect or recognize flaws at locations of the semiconductor wafer which lie comparatively far from these process control modules.

Another variant of the known semiconductor wafer has a larger number of process control modules but the process control modules are arranged in the so-called dicing paths, which dicing paths extend between the chips, which are arranged in rows and columns. Owing to the presence of the process control modules in these dicing paths it is necessary to make these dicing paths comparatively wide in order to accommodate the process control modules. As a result of this, the dicing paths are unnecessarily wide, which is a waste of space. For such process control modules arranged at the location of the dicing paths reference may also be made to the patent document U.S. Pat. No. 5,990,488 A, i.e. to the variant of a semiconductor wafer shown in FIG. 2 of said patent document and elucidated in the corresponding description.

In a further variant of a known semiconductor wafer a process control module is provided in the area of each chip of the semiconductor wafer. In practice, such a variant may be considered only when the chips are large-area chips, for which the fact that each chip has a separate process control module is less significant.

It is an object of the invention to avoid the restrictions and drawbacks of the known variants of a known semiconductor wafer and to realize an improved semiconductor wafer.

In order to achieve the aforementioned object a semiconductor wafer in accordance with the invention has characteristic features in accordance with the invention, in such a manner that a semiconductor wafer in accordance with the invention can be characterized in the manner defined hereinafter, namely:

A semiconductor wafer having a multitude of chips, of which chips each one of a given number of chips is situated in one of a multitude of adjacent exposure fields, and having process control modules which are each arranged in a given area on the semiconductor wafer, in which the given areas are formed by the exposure fields, and in which each process control module takes the place of at least one chip.

Owing to the provision of the characteristic features in accordance with the invention a satisfactory compromise is achieved between, on the one hand, a maximal number of process control modules, in order to guarantee a maximal detection accuracy for incorrectly fabricated areas of a semiconductor wafer in accordance with the invention, and, on the other hand, a minimal number of process control modules, in order to lose a minimal semiconductor wafer area usable for chip fabrication. A further advantage is obtained in the case of large semiconductor wafers with very small chips, i.e. roughly speaking in the case of semiconductor wafers having a diameter of, for example, 200 mm and chips having a chip area of less than 2.0 $mm^2$, because the individual exposure fields can be identified very easily, i.e. even with the naked eye, which greatly facilitates finding a specific chip with the aid of the provided process control module. This is useful not only during a manually and visually performed inspection of a semiconductor wafer but particularly during the automatic further processing of the chips provided on the semiconductor wafer. This is because during the automatic further processing the process control modules provided in the exposure fields can be used as a kind of coarse grating in order to position a device for the manipulation of the individual chips of the semiconductor wafer, for example a so-called pick-and place device, after which said device can be positioned within a previously approached exposure field with the aid of other positioning means. This ensures in a highly reliable manner that an erroneous removal of a chip from a semiconductor wafer is precluded.

With a semiconductor wafer in accordance with the invention it has proved to be very advantageous when a process control module is present in each of at least 25% of all the exposure fields and the process control modules are disposed at equal distances from one another. Such an embodiment has proved to be advantageous during tests which have been conducted, because such an embodiment yields the desired result with a comparatively small amount of space being required for the process control modules and in spite of this guarantees a high detection reliability as regards the detection of defective or imperfectly fabricated areas of the semiconductor wafer.

With a semiconductor wafer in accordance with the invention it has proved to be particularly advantageous when a process control module is present in each exposure field. This ensures a particularly high detection reliability.

With a semiconductor wafer in accordance with the invention it has further proved to be particularly advantageous when all the process control modules in the exposure fields are each situated at the same location. The centers of the exposure fields should then be regarded as a preferred location. This is particularly advantageous in view of a simple detection of the location of the process control modules and in view of a simple cooperation with the process control modules.

The aforementioned aspects as well as further aspects of the invention will be apparent from the example of an embodiment described hereinafter and will be elucidated with the aid of this example.

The invention will be described in more detail hereinafter with reference to an embodiment which is shown in the drawing by way of example but to which the invention is not limited.

Figure 1:
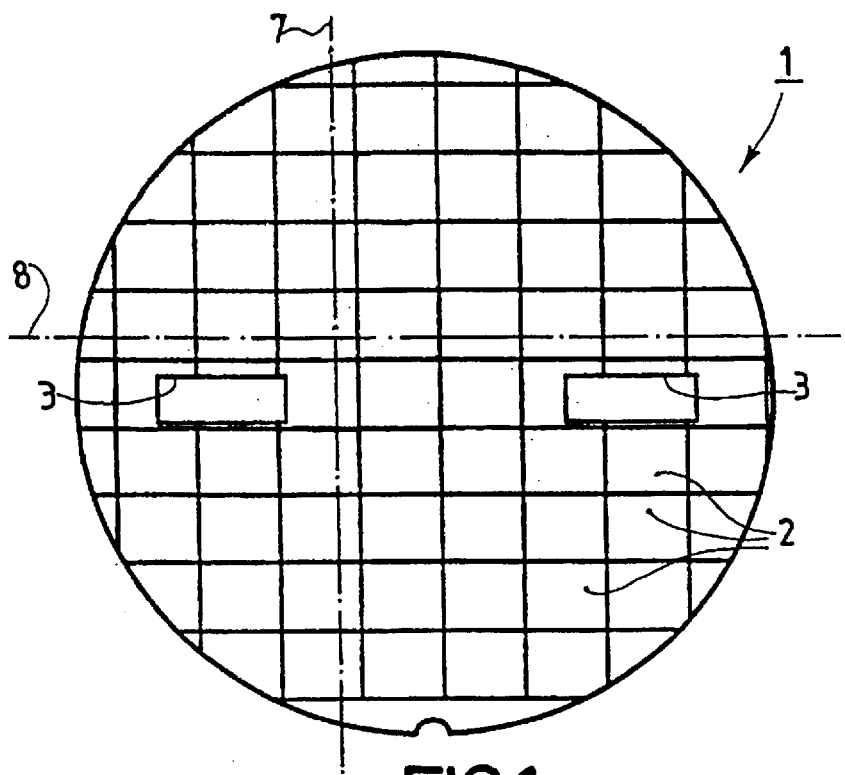
FIG. 1 shows a semiconductor wafer which is an embodiment of the invention in a highly diagrammatic manner, which semiconductor wafer has a multitude of exposure fields.
Figure 2:
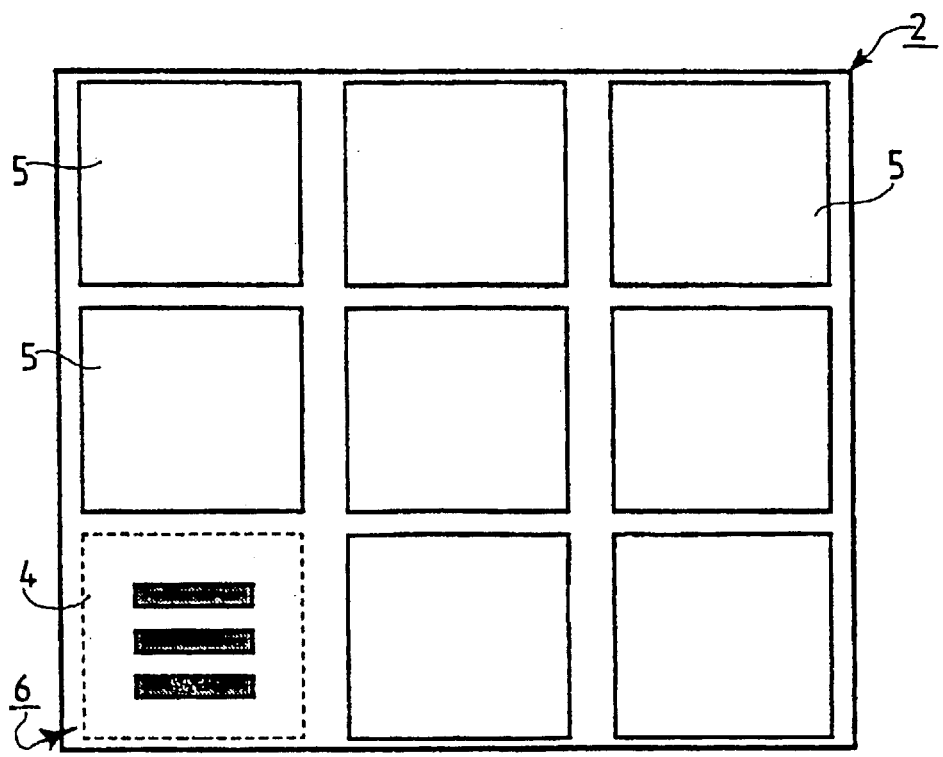
FIG. 2 shows an exposure field of the semiconductor wafer of FIG. 1 to a substantially larger scale than FIG. 1.

FIG. 1 shows a semiconductor wafer 1. The semiconductor wafer 1 comprises a multitude of chips. A given number of chips of this multitude of chips is situated in one of a multitude of adjacent exposure fields 2, which are each shown diagrammatically as a rectangle in FIG. 1. FIG. 2 shows such an exposure field 2.

In English-language jargon such exposure fields are referred to as "reticles". In the present case, the semiconductor wafer 1 has two so-called drop-in areas 3, which in known manner serve for positioning the semiconductor wafer 1 and at least one exposure mask during the fabrication of the semiconductor wafer 1.

In the semiconductor wafer 1 the given areas in which a process control module is present are formed by the exposure fields 2. FIG. 2 shows such a process control module 4 in broken lines to mark the difference with respect to the chips 5 present in the exposure field 2. As is apparent from FIG. 2, a process control module 4 has been provided in the reticle 2 in place of a chip 5. This applies to all the exposure fields 2 in which a process control module 4 has been provided in place of a chip 2. In the semiconductor wafer 1 shown in FIGS. 1 and 2 a process control module 4 is present in each exposure field 2, but this is not necessarily so. The process control modules 4 are arranged in the exposure fields 2 in such a manner that all the process control modules 4 are situated at the same location within an exposure field 2. In the case of the semiconductor wafer 1 shown in FIGS. 1 and 2 all the process control modules 4 are situated in the front-left corner areas 6 of the exposure fields 2 as is shown in FIGS. 1 and 2. However, this is not strictly necessary because alternatively the process control modules 4 may be situated at any other location in the exposure fields 2, preferably a location in the center of the exposure field 2.

It is to be noted once more that it is not strictly necessary to provide a process control module 4 in each exposure field 2. It is also possible to provide a process control module 4 in each of only 50% or 25% of the exposure fields, but in that case it also advantageous if the process control modules 4 are situated at equal distances from each other with respect to two mutually perpendicular coordinate directions, which two mutually perpendicular coordinate directions are shown as two dash-dot lines 7 and 8 in FIG. 1. Furthermore, it is to be noted that the process control modules 4 need not be provided in place of only one chip 5 but may also be provided in place of two or more chips 5 if this is effective, which is so in the case of chips 5 of a particularly small area.

What is claimed is:

1. A semiconductor wafer (1) having a multitude of chips (5), of which chips (5) each one of a given number of chips (5) is situated in one of a multitude of adjacent exposure fields (2), and having process control modules (4) which are each arranged in a given area on the semiconductor wafer (1), in which the given areas are formed by the exposure fields (2), and in which each process control module (4) takes the place of at least one chip (5).

2. A semiconductor wafer (1) as claimed in claim 1, in which a process control module (4) is present in each one of at least 25% of all the exposure fields (2), and in which the process control modules (4) are situated at equal distances from each other with respect to two mutually perpendicular coordinate directions (7, 8).

3. A semiconductor wafer (1) as claimed in claim 2, in which a process control module (4) is present in each exposure field (2).

4. A semiconductor wafer (1) as claimed in claim 1, in which all the process control modules (4) are each situated at the same location (6) in the respective exposure fields (2).

* * * * *